(12) United States Patent
Shirochi

(10) Patent No.: US 10,300,533 B2
(45) Date of Patent: May 28, 2019

(54) COATED CUTTING TOOL

(71) Applicant: TUNGALOY CORPORATION, Yoshima-Kogyodanchi, Iwaki-shi, Fukushima (JP)

(72) Inventor: Tsukasa Shirochi, Iwaki (JP)

(73) Assignee: TUNGALOY CORPORATION, Iwaki-Shi, Fukushima (JP)

( * ) Notice: Subject to any disclaimer, the term of this patent is extended or adjusted under 35 U.S.C. 154(b) by 170 days.

(21) Appl. No.: 15/500,784

(22) PCT Filed: Jul. 31, 2015

(86) PCT No.: PCT/JP2015/071747
§ 371 (c)(1),
(2) Date: Jan. 31, 2017

(87) PCT Pub. No.: WO2016/017790
PCT Pub. Date: Feb. 4, 2016

(65) Prior Publication Data
US 2017/0216929 A1 Aug. 3, 2017

(30) Foreign Application Priority Data
Aug. 1, 2014 (JP) ................................. 2014-157251

(51) Int. Cl.
*B23B 27/14* (2006.01)
*C23C 14/06* (2006.01)
*B23D 61/02* (2006.01)

(52) U.S. Cl.
CPC ............ *B23B 27/148* (2013.01); *B23B 27/14* (2013.01); *B23D 61/028* (2013.01);
(Continued)

(58) Field of Classification Search
USPC .......... 51/307, 309; 428/216, 336, 697, 698, 428/699
See application file for complete search history.

(56) References Cited

U.S. PATENT DOCUMENTS

2011/0058909 A1  3/2011  Matsuzawa
2011/0303061 A1  12/2011  Sundstrom et al.
(Continued)

FOREIGN PATENT DOCUMENTS

EP  1 536 041 A2  11/2004
EP  2 604 720 A1  12/2011
(Continued)

OTHER PUBLICATIONS

Shetty et al "Formation of (113) texture in fcc nitride thin films and its influence on the film properties" Thin Solid Films 528 (2013) p. 255-262. (Year: 2013).*

(Continued)

*Primary Examiner* — Archene A Turner
(74) *Attorney, Agent, or Firm* — Foley & Lardner LLP

(57) ABSTRACT

A coated cutting tool has a substrate and a coating layer formed onto a surface of the substrate. The coating layer contains a hard layer of a composition represented by $(Ti_xM_{1-x})N$, wherein M represents at least one kind of an element selected from the group consisting of Zr, Hf, V, Nb, Ta, Cr, Mo, W, Al, Si and Y, and x represents an atomic ratio of a Ti element based on a sum of the Ti element and an M element, and satisfies $0.45 \leq x \leq 0.9$. Also, an average grain size of grains constituting the hard layer is 200 nm or more and 600 nm or less, and the grains of the hard layer satisfy predetermined conditions.

15 Claims, 2 Drawing Sheets

Orientation difference

(52) U.S. Cl.
CPC ...... *C23C 14/0641* (2013.01); *B23B 2222/16* (2013.01); *B23B 2222/28* (2013.01); *B23B 2226/125* (2013.01); *B23B 2226/18* (2013.01); *B23B 2228/08* (2013.01); *B23B 2228/105* (2013.01)

(56) References Cited

U.S. PATENT DOCUMENTS

2014/0308083 A1* 10/2014 Bjormander ............ C23C 16/36 407/119
2015/0203956 A1 7/2015 Asari et al.

FOREIGN PATENT DOCUMENTS

| JP | H 07-205361 A | | 8/1995 |
|---|---|---|---|
| JP | H 10330914 A | | 12/1998 |
| JP | H11-140647 A | | 5/1999 |
| JP | 2002-205204 A | | 7/2002 |
| JP | 2003-200306 A | | 7/2003 |
| JP | 2008-105164 A | | 5/2008 |
| JP | 2009-269097 A | | 11/2009 |
| JP | 2014-024130 | * | 2/2014 |
| WO | WO-2013/131943 A1 | | 9/2013 |

OTHER PUBLICATIONS

Delisle et al, Surface morphology and texture of TiAln/Crn multilayer coatings, Thin Solid Films, 2012, pp. 100-106.
Extended European Search Report dated Feb. 19, 2018 in corresponding application No. 15826867.2.
International Search Report dated Sep. 1, 2015 issued in International (PCT) Application (No. PCT/JP2015/071747).
Written Opinion dated Sep. 1, 2015 issued in International (PCT) Application (No. PCT/JP2015/071747).
Karimi, A. et al., "Off-axis texture in nanostructured Ti1-xAlXN thin films" , Surface and Coatings Technology, 2008, pp. 2241-2246, vol. 202, Elsevier.
Japanese office action received in corresponding Japanese application No. 2016-538457 dated Sep. 12, 2017 with English translation.
Japanese Office Action dated Apr. 3, 2018 in corresponding application No. 2016-538457.

* cited by examiner

COATED CUTTING TOOL

RELATED APPLICATIONS

This is a 371 US National Phase of International Patent Application No. PCT/JP2015/071747, filed Jul. 31, 2015, which published as WO2016/017790A1 on Feb. 4, 2016, which claims priority to JP 2014-157251, filed Aug. 1, 2014. The contents of the aforementioned applications are incorporated by reference in their entirety.

TECHNICAL FIELD

The present invention relates to a coated cutting tool.

BACKGROUND ART

In recent years, demand for cutting with high efficiency has been increased. Accompanying with this increase, a cutting tool having a longer tool life than that of the conventional ones has been required. Therefore, as characteristics required for the tool materials, it is more important to improve wear resistance and fracture resistance relating to lifetime of a cutting tool. Thus, as a coated cutting tool improved in these characteristics, a coated cutting tool which comprises a substrate such as a cemented carbide, cermet, cBN, etc., and one layer or two layers or more of a coating layer(s) such as a TiN layer, a TiAlN layer, etc., formed on the surface thereof has widely been used.

Various techniques for improving characteristics of the coating layer have been proposed for the purpose of further improvement in the above-mentioned wear resistance and fracture resistance. For example, in Patent document 1, a laminated coating member containing a predetermined crystal-oriented hard film has been proposed. The laminated coating member has a substrate, and a first coating layer and a second coating layer laminated thereon. These both of the coating layers are constituted by one kind of a single layer or two or more kinds of a plural layers of a nitride, a carbonitride, a nitroxide, a carboxide and a carbonitroxide of Ti and Al. The first coating layer has the maximum peak intensity at a (200) crystal face, and the second coating layer has the maximum peak intensity at a (111) crystal face.

In Patent document 2, a cutting tool insert comprising a cemented carbide body and a predetermined coating film has been proposed. The coating film is a single layer of $(Ti_{1-x}Al_x)N$ (x is an atomic ratio, and is 0.25 to 0.50). In addition, the coating film is oriented to a (200) face with regard to the orientation.

As in the above-mentioned Patent documents 1 and 2, in the compound layer of Ti and Al, it has been known that the characteristics of the coating layer are controlled by controlling a diffraction intensity in the X-ray diffraction. In particular, it has been known that orientation is controlled to the (111) face, peeling resistance and oxidation resistance of the cutting tool are improved. In addition, it has been known that orientation is controlled to the (200) face, wear resistance of the cutting tool is improved.

PRIOR ART DOCUMENT

Patent Document

Patent document 1: JP Hei.10-330914A
Patent document 2: JP 2009-90452A

SUMMARY OF THE INVENTION

Problems to be Solved by the Invention

In a cutting process in recent years, high speed, high feeding and deep cutting are more required. Thus, cracks generated at the surface of the tool due to the load applied to the blade edge during the processing propagate to the substrate. In addition, cracks generated at the substrate by raising or lowering a temperature of the blade edge during the above-mentioned processing propagate into a coating layer. Fracture of the tool caused by the above can be seen frequently.

Under such a background, in the above-mentioned conventional coated cutting tool, there is a problem that fracture of the tool is likely generated since toughness of the coating layer is insufficient.

The present invention has been done to solve these problems. That is, an object of the present invention is to provide a coated cutting tool applied to a severer cutting, which is a coated cutting tool improved in fracture resistance without lowering wear resistance and can be applied to processing for a long period of time.

Means to Solve the Problems

The present inventor has intensively studied on elongation of tool life of a coated cutting tool. As a result, he has found that fracture resistance can be improved without lowering wear resistance by the following constitution. According to the constitution, tool life of the coated cutting tool could be elongated.

That is, the summary of the present invention is as follows.

(1) A coated cutting tool which comprises a substrate and a coating layer formed onto a surface of the substrate,
the coating layer contains a hard layer having a composition represented by $(Ti_xM_{1-x})N$ [wherein M represents at least one kind of an element selected from the group consisting of Zr, Hf, V, Nb, Ta, Cr, Mo, W, Al, Si and Y, and x represents an atomic ratio of a Ti element based on a sum of the Ti element and an M element, and satisfies $0.45 \leq x \leq 0.9$.],
an average grain size of grains constituting the hard layer is 200 nm or more and 600 nm or less, and
in a polished surface of the hard layer substantially parallel to a surface of the substrate, an angle formed by a normal line of the polished surface and a normal line at a cubic (311) plane of the grains of the hard layer is obtained as an orientation difference, a total of an area A of a cross-section of the grains of the hard layer in the polished surface, the orientation difference of which is within a range of 0° or more and 35° or less, is made 100 area %, the area of the cross-section of the hard layer where the orientation difference is within the range of 0° or more and 35° or less is divided for each pitch of 5°, and when a total of an area B of a cross-section of grains in each division is obtained as a ratio based on the total A, then a division in which the total of an area B of the cross-section of the grains of the hard layer is the maximum exists within the range of the orientation difference of 0° or more and less than 15°.

(2) The coated cutting tool of (1), wherein a ratio Sa of a total of areas of the cross-section of the grains of the hard layer, the orientation difference of which is within the range of 0° or more and less than 15°, based on the total A is 55 area % $\leq Sa \leq$ 90 area %.

(3) The coated cutting tool described in (1) or (2), wherein an average thickness of the hard layer is 0.5 µm or more and 10 µm or less.

(4) The coated cutting tool of any of (1) to (3), wherein the hard layer has compression stress.

(5) The coated cutting tool of any of (1) to (4), wherein the hard layer has compression stress of 0.2 GPa or more and 3 GPa or less.

(6) The coated cutting tool of any of (1) to (5), wherein the coating layer has a lower layer between the substrate and the hard layer, and the lower layer has a composition represented by $(Al_y L_{1-y})N$ [wherein L represents at least one kind of an element selected from the group consisting of Ti, Zr, Hf, V, Nb, Ta, Cr, Mo, W, Si and Y, and y represents an atomic ratio of an Al element based on a sum of the Al element and an L element, and satisfies $0.6 \leq y \leq 0.9$.].

(7) The coated cutting tool of (6), wherein an average thickness of the lower layer is 0.2 µm or more and 5 µm or less.

(8) The coated cutting tool of any of (1) to (7), wherein a total thickness of the coating layer is 0.5 µm or more and 10 µm or less.

(9) The coated cutting tool of any of (1) to (8), wherein the substrate is any of a cemented carbide, cermet, ceramics or a cubic boron nitride sintered body.

Effects of the Invention

The coated cutting tool of the present invention is improved in fracture resistance without lowering wear resistance. Therefore, the coated cutting tool of the present invention accomplishes the effect that it can elongate the tool life than those of the conventional ones.

EMBODIMENTS TO CARRY OUT THE INVENTION

Figure 1:
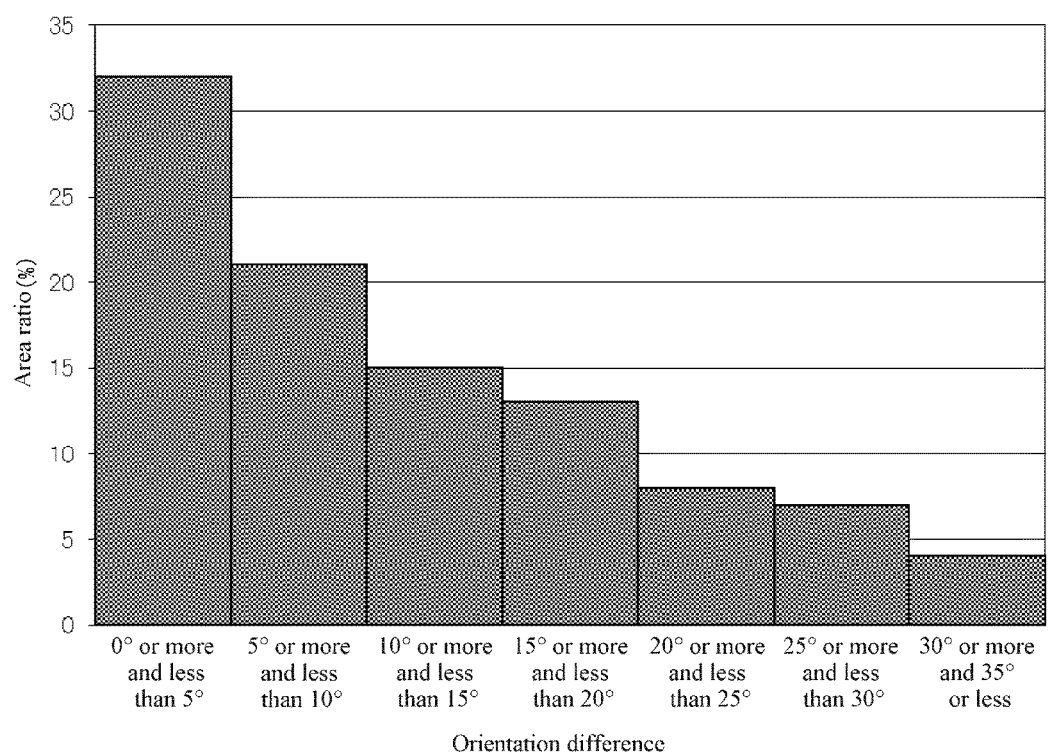
FIG. 1 is a graph of the present product 6 in Example in which a division of a pitch of 5° is taken on the horizontal axis, and a ratio (an area ratio) of a total of an area B of a cross-section of grains of the hard layer in the each division per an each pitch based on a total A is taken on the vertical axis.

In the following, the present invention is explained in detail.

The coated cutting tool of the present invention contains a substrate and a coating layer formed onto the surface of the substrate. As the substrate, it can be used without particular limitation so long as it is a material which has conventionally been used as a substrate of a coated cutting tool. Examples of the substrate may be mentioned a cemented carbide, a cermet, ceramics, a cubic boron nitride sintered body, a diamond sintered body, a high speed steel, etc. Among these, the substrate is preferably either of a cemented carbide, a cermet, ceramics and a cubic boron nitride sintered body. This is because the coated cutting tool of the present invention is excellent in wear resistance and fracture resistance.

A total thickness of the coating layer in the coated cutting tool of the present invention is preferably 0.5 µm or more and 10 µm or less. If the total thickness of the coating layer is less than 0.5 µm, wear resistance of the coated cutting tool tends to be lowered. On the other hand, if the total thickness of the coating layer exceeds 10 µm, fracture resistance of the coated cutting tool tends to be lowered. From these viewpoints, the total thickness of the coating layer is further preferably 1.5 to 8.0 µm.

Incidentally, in the present invention, the total thickness of the coating layer is defined to be a sum of average thicknesses of the respective layers constituting the coating layer including the hard layer and a lower layer mentioned later, etc.

In the following, the respective layers constituting the coating layer in the coated cutting tool of the present invention are explained.

The above-mentioned coating layer contains a hard layer. The above-mentioned hard layer has a composition represented by $(Ti_x M_{1-x})N$. According to this composition, excellent wear resistance is provided to the coated cutting tool of the present invention. Two or more hard layers may exist in the coating layer.

Incidentally, M represents at least one kind of an element selected from the group consisting of Zr, Hf, V, Nb, Ta, Cr, Mo, W, Al, Si and Y. Also, x represents an atomic ratio of a Ti element based on a sum of the Ti element and the M element, and satisfies $0.45 \leq x \leq 0.9$. By containing the M element, the coated cutting tool of the present invention has excellent wear resistance and oxidation resistance.

In particular, it is preferred that the M element is Al since oxidation resistance of the coated cutting tool is improved. According to this constitution, occurrence of fracture due to progress of crater wear can be delayed.

If an atomic ratio x of the Ti element is less than 0.45, the content of Ti becomes a little so that wear resistance of the coated cutting tool is lowered. On the other hand, if the atomic ratio x exceeds 0.9, the effect of containing the M element cannot be obtained so that wear resistance and oxidation resistance of the coated cutting tool are lowered.

Incidentally, in the present invention, when the composition of the coating layer is represented by $(M_a L_b)N$, it means in the composition that an atomic ratio of the M element based on the whole metallic element is a, and an atomic ratio of the L element is b. For example, $(Al_{0.55} Ti_{0.45})N$ means that the atomic ratio of the Al element based on the whole metallic element is 0.55, and the atomic ratio of the Ti element based on the whole metallic element is 0.45. That is, the amount of the Al element based on the whole metallic element is 55 atomic %, and the amount of the Ti element based on the whole metallic element is 45 atomic %.

An average thickness of the hard layer in the coating layer of the coated cutting tool of the present invention is preferably 0.5 µm or more and 10 µm or less. If the average thickness of the hard layer is less than 0.5 µm, wear resistance of the coated cutting tool tends to be lowered. On the other hand, if the average thickness of the hard layer exceeds 10 µm, fracture resistance of the coated cutting tool tends to be lowered. From these viewpoints, the average thickness of the hard layer is more preferably 1.5 µm or more and 8 µm or less. Incidentally, a method of obtaining the average thickness of the hard layer is mentioned later.

An average grain size of grains constituting the hard layer in the coated cutting tool of the present invention is 200 nm or more and 600 nm or less. If the average grain size is less than 200 nm, wear resistance of the coated cutting tool is lowered. On the other hand, if the average grain size exceeds 600 nm, fracture resistance of the coated cutting tool is lowered. From these viewpoints, the average grain size of the grains constituting the hard layer is preferably 200 nm or more and 400 nm or less. Incidentally, a method of obtaining the average grain size is mentioned later.

With regard to the hard layer in the coating layer of the coated cutting tool of the present invention, in the polished surface substantially parallel to the surface of the substrate, when an angle formed by a normal line of the polished surface and a normal line at the cubic (311) plane of the grains of the hard layer is made an orientation difference, the following is established. First, a total of an area A of a cross-section of grains of the hard layer, the orientation difference of which is within the range of 0° or more and 35° or less, in the above-mentioned polished surface, is made 100 area %. On the other hand, the area of the cross-section of the grains of the hard layer, the orientation difference of which is within the range of 0° or more and 35° or less, is divided for each pitch of 5°. When it is divided for as mentioned above, a total of an area B of the cross-section of the above-mentioned grains of the hard layer existing in each of the divisions can be obtained. The total B is shown as a ratio (an area ratio) based on the above-mentioned total A (100 area %). That is, it is obtained as whether the total of the area B of the cross-section of the grains in the respective division occupies how many area % among the above-mentioned 100 area %.

As mentioned above, for example, a graph can be prepared in which a division of a pitch of 5° is taken on the horizontal axis, and on the vertical axis, an area ratio of the total of the area B of the cross-section of the grains of the hard layer in the respective divisions per each pitch is taken. This graph is to show a distribution of the total value of the area (the total B) of the cross-section of the grains of the hard layer contained in each division by dividing for the orientation difference starting from 0° as a starting point and dividing with an interval of 5° like 0° or more and less than 5°, 5° or more and less than 10°, 10° or more and less than 15° and so on.

In the coated cutting tool of the present invention, the division in which the total of the area B of the cross-section of the grains of the hard layer is the maximum exists within the range of the orientation difference being 0° or more and less than 15°.

The coated cutting tool of the present invention has the hard layer satisfying such conditions so that it is excellent in the balance between wear resistance and fracture resistance. From such a viewpoint, it is further preferred that the division in which the total of the area B of the cross-section of the grains of the hard layer is the maximum exists within the range of the orientation difference being 5° or more and less than 15°. If the division in which the total of the area B of the cross-section of the grains of the hard layer is the maximum exists within the range of the orientation difference being larger than 15°, either of wear resistance or fracture resistance of the coated cutting tool is lowered.

Incidentally, "the area of the cross-section of the grains of the hard layer, the orientation difference of which is within the range of 0° or more and 35° or less, is divided for each pitch of 5°. . . . a division in which the total of an area B of the cross-section of the grains of the hard layer is the maximum exists within the range of the orientation difference of 0° or more and less than 15° " explained as above corresponds to the following exemplary case.

The orientation difference up to 35° or less is divided for an interval of 5° like 0° or more and less than 5°, 5° or more and less than 10°, 15° or more and less than 20° and so on. Incidentally, in the present invention, the division of each pitch of 5° is carried out with 0° as the starting point, and a division like 1° or more and less than 6° is not carried out. And the total of the area B of the cross-section of the grains of the hard layer in the division of 5° or more and less than 10° is made higher than any other total of the area B of the cross-section of the grains of the hard layer such as 0° or more and less than 5° or 20° or more and less than 25°, etc. In this case, the above-mentioned total B in the division of 5° or more and less than 10° is the maximum. Therefore, this example corresponds to "the division in which the total of an area B of the cross-section of the grains of the hard layer is the maximum exists within the range of the orientation difference of 0° or more and less than 15°."

Incidentally, the total of the area B of the cross-section of the grains of the hard layer in the respective division is expressed by a ratio (an area ratio) based on the total of the area A of the cross-section of the grains of the hard layer in which the above-mentioned orientation difference is within the range of 0° or more and 35° or less. Therefore, the above-mentioned total of the area B of the cross-section of the grains is expressed by, for example, the numerical value as 25 area %.

With regard to the hard layer in the coating layer of the coated cutting tool of the present invention, when the ratio (an area ratio) of the total of the area of the cross-section of the grains of the hard layer in which the orientation difference is within the range of 0° or more and less than 15° based on the above-mentioned total A is made Sa, it is preferably 55 area %≤Sa≤90 area %. This is because if it is within the range, occurrence of chipping which becomes the starting point of fracture can be suppressed without lowering wear resistance of the coated cutting tool. If Sa is less than 55 area %, wear resistance or chipping resistance of the coated cutting tool tends to be lowered. This is because the grains having the orientation difference of larger than 15° occupy the most part of the hard layer. On the other hand, it is substantially difficult to make Sa larger as exceeding 90 area %.

Incidentally, the polished surface of the hard layer at the time of obtaining the orientation difference explained above means the following. That is, the coated cutting tool is subjected to mirror polishing from the surface which is the opposite side to the substrate. Then, polishing is carried out until the hard layer is exposed in the direction parallel or substantially parallel to the surface of the substrate, and the obtained surface of the hard layer is "the polished surface of the hard layer." At this time, it is preferred that the polished amount of the hard layer does not exceed 50% of the average thickness of the hard layer. A method for mirror polishing the hard layer may be, for example, polishing by using a diamond paste or colloidal silica, or ion milling, etc.

Incidentally, the total (the total B) in the division of the respective orientation differences of the area of the cross-section of the grains of the hard layer in the coating layer in the coated cutting tool of the present invention can be obtained as mentioned below. First, the above-mentioned mirror polished surface of the hard layer is prepared. By using an electron backscatter diffraction image device (EBSD) attached to a scanning electron microscope (SEM) or a field emission scanning electron microscope (FE-SEM), etc., the area of the cross-section of the respective grains can be measured. The crystal orientation of the respective crystals of the grains constituting the hard layer is specified by using EBSD, and the area of the cross-section of the grains of the specified respective crystal orientation is allocated to the division of the above-mentioned pitch of 5°. And the ratio of the summed value (total B) of the area of the cross-section of the grains in the respective divisions based on the above-mentioned total A (100 area %) is obtained.

More specifically, it can be obtained by the following method. The sample obtained by subjecting the hard layer to mirror polishing is set to FE-SEM. An electron beam is irradiated to the sample with an incident angle of 70°, and an accelerating voltage of 15 kV and an irradiation current of 0.5 nA. With regard to the measurement range of 30 μm×50 μm, it is desired to obtain the orientation difference of the cross-section of the grains existing in the said range with the setting of EBSD of the step size of 0.05 μm. The polished surface is prepared with regard to the portion participating to cutting of the coated cutting tool, and the measurement is carried out with one visual field of the measurement range of the above-mentioned 30 μm×50 μm. As long as it is the portion participating to the above-mentioned cutting, the total of the area B of the cross-section of the grains of the division of the respective orientation differences is not markedly changed depending on the position of the visual field to be measured.

The hard layer in the coating layer of the coated cutting tool of the present invention preferably has compression stress. This is because toughness of the hard layer is improved by the compression stress, whereby fracture resistance of the coated cutting tool is improved. In particular, the compression stress of the hard layer is further preferably 0.2 GPa or more and 3 GPa or less. If the compression stress is less than 0.2 GPa, fracture resistance of the coated cutting tool is sometimes lowered. Also, if the compression stress exceeds 3 GPa, the coating layer itself is sometimes peeled off from the substrate.

Incidentally, the above-mentioned compression stress can be measured by the $\sin^2 \psi$ method using the X-ray stress measurement device. And the compression stress can be obtained by measuring optional 10 points (these respective points are preferably so selected that these are separated with the distance of 0.5 mm or more to each other so that these represent the stresses of the respective portions) contained in the portion participating to cutting of the hard layer by the $\sin^2 \psi$ method and calculating the average value.

The coating layer in the coated cutting tool of the present invention may be constituted by the hard layer alone, and preferably contains a lower layer between the substrate and the hard layer. This is because adhesiveness between the substrate and the hard layer is improved. In particular, the lower layer preferably comprises a composition represented by $(Al_y L_{1-y})N$. This is because the coated cutting tool is excellent in balance of wear resistance and adhesiveness between the substrate and the hard layer. Incidentally, L represents at least one kind of an element selected from the group consisting of Ti, Zr, Hf, V, Nb, Ta, Cr, Mo, W, Si and Y. Also, y represents an atomic ratio of the Al element based on the total of the Al element and the L element, and satisfies $0.6 \le y \le 0.9$. If the lower layer contains the L element, wear resistance of the coated cutting tool tends to be improved. In particular, when the L element is Ti or Cr, it is preferred since wear resistance of the coated cutting tool is further improved. If the atomic ratio y of the Al element is less than 0.6, adhesiveness of the substrate and the coating layer tends to be lowered. This is because the content of Al becomes a little. Also, if the atomic ratio y exceeds 0.9, wear resistance of the coated cutting tool tends to be lowered. This is because it is not easy to obtain the effect of containing the L element.

In the coated cutting tool of the present invention, an average thickness of the lower layer is preferably 0.2 μm or more and 5 μm or less. This is because it shows the tendency that adhesiveness between the substrate and the coating layer is improved. Incidentally, a method of obtaining the average thickness of the lower layer is mentioned later.

In the coated cutting tool of the present invention, an upper layer may be formed onto the surface of the hard layer. The upper layer is preferably a single layer or a plural number of layers of a compound (provided that the composition is different from that of the hard layer) constituted by at least one kind of an element selected from the group consisting of Ti, Zr, Hf, V, Nb, Ta, Cr, Mo, W, Al, Si and Y, and at least one kind of an element selected from the group consisting of C, N, B and O. If such a structure is employed, the coated cutting tool is excellent in wear resistance.

In the coated cutting tool of the present invention, a method for forming the coating layer explained above onto the substrate is not particularly limited. An example of the method is the physical vapor deposition method such as the ion plating method, the arc ion plating method, the sputtering method and the ion mixing method, etc. Among these, the arc ion plating method is preferred. This is because if the coating layer is formed by the method, adhesiveness between the coating layer and the substrate is excellent.

The process for preparing the coated cutting tool of the present invention is explained by referring to specific examples. Incidentally, the process for preparing the coated cutting tool of the present invention is not particularly limited so long as it can accomplish the constitution of the coated cutting tool.

A substrate processed to a tool shape is charged in a reaction vessel of a physical vapor deposition device. Further, the metal evaporation source is placed in the reaction vessel. Thereafter, inside of the reaction vessel is evacuated until a pressure becomes $1 \times 10^{-2}$ Pa or lower. Subsequently, the substrate is heated by a heater in the reaction vessel until the temperature thereof became 200 to 800° C. After heating, an Ar gas is introduced into the reaction vessel, and the pressure is made 0.5 to 5.0 Pa.

Under the Ar gas atmosphere with the pressure of 0.5 to 5.0 Pa, a bias voltage with −200 to −1,000V is applied to the substrate, and a current with 5 to 20A is passed through the tungsten filament in the reaction vessel to carry out an ion bombardment treatment onto the surface of the substrate by an Ar gas. After the surface of the substrate is subjected to the ion bombardment treatment, the reaction vessel is evacuated so that a pressure inside thereof becomes $1 \times 10^{-2}$ Pa or lower.

Then, the substrate is heated until the temperature thereof became 300° C. to 500° C. as needed. A reaction gas such as a nitrogen gas, etc., is introduced into the reaction vessel, and a pressure in the reaction vessel is made 0.5 to 5.0 Pa.

Thereafter, a nuclei forming process is carried out. In the process, a bias voltage of −10 to −80V is applied to the substrate, and the metal evaporation sources corresponding to the metallic components of the hard layer in the coating layer are evaporated by an arc discharge of 60 to 100 A. According to this procedure, the nuclei of the hard layer is formed by dispersing these onto the surface of the substrate with a thickness of 20 to 100 nm.

Incidentally, in the nuclei forming process as explained above, nuclei with fine particles and nuclei with coarse particles can be dispersedly formed by repeating evaporation of the metal evaporation sources and stopping thereof whereby the growth rates of the nuclei are changed. More specifically, with regard to the arc discharge to the metal evaporation sources corresponding to the metallic components of the hard layer in the coated cutting tool of the present invention, an arc discharge for 0.5 to 2 minutes and stopping of an arc discharge for 0.5 to 2 minutes are alternately repeated. When such an intermittent discharge is carried out, the nuclei with fine particles and the nuclei with coarse particles can be dispersedly formed. Incidentally, if either of the time of the arc discharge or the time of stopping the arc discharge is shorter than 0.5 minute, change in the growth rates of the nuclei is small, so that the nuclei with fine particles and the nuclei with coarse particles cannot be dispersedly formed. On the other hand, if either of the time of the arc discharge or the time of stopping the arc discharge is longer than 2 minutes, the formation time of the nuclei is long and the thickness thereof exceeds 100 nm, so that it is not advantageous. Incidentally, the thickness of the nuclei of the hard layer can be obtained from the growth rate per a unit time in the nuclei forming process.

After subjecting to the nuclei forming process, when the film forming process is carried out, the hard layer which satisfies the conditions of the present invention that the division in which the total of the area B of the cross-section of the grains of the hard layer is the maximum exists within the range of the orientation difference of 0° or more and less than 15°, can be obtained. In the said process, a bias voltage of −40 to −150V is applied to the substrate, and the metal evaporation sources corresponding to the metallic components of the respective layers are evaporated by an arc discharge of 80 to 150 A. According to this procedure, the hard layer is formed.

In the hard layer, for making an area ratio (Sa) larger, which is the total of the area of the cross-section of the grains of the hard layer, the orientation difference of which is within the range of 0° or more and less than 15°, it is better to form a predetermined lower layer explained as mentioned above to form nuclei of the hard layer onto the surface of the lower layer. The above-mentioned lower layer comprises a nitride in which an atomic ratio of the Al element based on the total of the Al element and the L element is 0.6 or more.

For imparting a predetermined compression stress to the hard layer in the coated cutting tool of the present invention, it is better to make an absolute value of the bias voltage applied to the substrate large in the film forming process. More specifically, when the cases where the bias voltage of −40V and −100V are compared to each other, since the absolute value of the bias voltage is larger in the case of −100V, so that the compression stress to be imparted to the hard layer is larger in the case of −100V.

For controlling the average grain size of the grains constituting the hard layer in the coated cutting tool of the present invention, it is better to adjust the temperature of the substrate in the film forming process. In the film forming process, if the temperature of the substrate is made high, an average grain size of the grains of the hard layer becomes small. Thus, by making the temperature of the substrate in the film forming process 400° C. or higher and 600° C. or lower, the average grain size of the grains of the hard layer can be made 200 nm or more and 600 nm or less.

Next, a method of obtaining a thickness, etc., of the respective layers of the present invention is explained.

The thicknesses of the respective layers (the hard layer, the lower layer, the upper layer, etc.) constituting the coating layer in the coated cutting tool of the present invention can be measured as an average thickness by using an optical microscope, a scanning electron microscope (SEM), or a transmission electron microscope (TEM), etc. The average thicknesses can be obtained as follows. At the position nearer to 50 µm from the blade edge of the surface opposed to the metal evaporation sources toward the center portion of said surface, the cross-sectional surface is observed at the three points or more. Thicknesses of the respective layers at these respective cross-sectional surfaces are measured. By calculating the average value of the three measured values, the average thickness can be obtained.

Also, the compositions of the respective layers constituting the coating layer in the coated cutting tool of the present invention can be measured from the cross-sectional structure of the tool by using an energy dispersive X-ray spectrometry (EDS) or a wavelength dispersive X-ray spectrometry (WDS), etc.

In the present invention, an average grain size of the grains constituting the hard layer can be obtained by observing the cross-sectional structure of the hard layer. More specifically, it is as follows. Mirror polishing is carried out until the surface of the hard layer which is the surface substantially parallel to the surface of the substrate is exposed. Or else, mirror polishing is carried out from the interface between the upper layer and the hard layer toward the inside until unevenness of the hard layer disappears. The obtained mirror polished surface is made a cross-sectional structure. When an average grain size of grains of the hard layer is to be obtained, the cross-sectional structure near to the surface of the hard layer may be observed, or the cross-sectional structure at the inside of the hard layer may be observed. A method for mirror polishing the hard layer may be, for example, polishing by using a diamond paste or colloidal silica, or ion milling, etc. The cross-sectional structure excluding the droplets having a diameter of 100 nm or more is observed by FE-SEM, TEM, or an electron backscatter diffraction device (EBSD), etc. In the obtained image, a diameter of the circle with the equal area to the area of the respective grains constituting the hard layer is made a grain diameter of the grain. When the grain size is obtained from the cross-sectional structure of the hard layer, an image analysis software may be used. Incidentally, in the cross-sectional structure of the hard layer, droplets having a diameter of 100 nm or more and other than the droplets can be easily differentiated. When the cross-sectional structure is observed, the droplets are circular shapes, a void with a width of several nm to several tens nm is formed around the droplets. Also, the droplets are sometimes coming off from the hard layer during the mirror polishing, and in such a case, a hole with a circular shape is formed at the hard layer. Therefore, in the cross-sectional structure of the hard layer, droplets having a diameter of 100 nm or more and the portion other than the droplets can be easily differentiated. The grain sizes of the respective grains excluding the droplets are obtained, and an average thereof is obtained as an average grain size of the grains constituting the hard layer in the present invention.

Incidentally, the visual field at the time of observing the cross-sectional structure is, for example, one visual field of 30 µm×50 µm mentioned later. As long as it is the portion participating to cutting, the average grain size is not markedly changed depending on the position of the visual field to be observed.

A kind of the coated cutting tool of the present invention may be, more specifically, a indexable cutting insert for milling or turning, a drill or end mills.

EXAMPLES

As a substrate, a cemented carbide corresponding to P20 having an ISO standard CNMG120408 insert shape was prepared. In the reaction vessel of an arc ion plating device, metal evaporation sources which became the compositions of the respective layers shown in Table 1 and Table 2 were arranged. The prepared substrate was fixed to a fixing metal fitting of a rotary table in the reaction vessel.

Thereafter, inside of the reaction vessel was evacuated until the pressure therein became $5.0 \times 10^{-3}$ Pa or lower. After evacuation, the substrate was heated by a heater in the reaction vessel until the temperature thereof became 500° C. After heating, an Ar gas was introduced into the reaction vessel so that the pressure therein became 5.0 Pa.

At an Ar gas atmosphere with a pressure of 5.0 Pa, a bias voltage with −800V was applied to the substrate, a current of 10 A was passed through the tungsten filament in the reaction vessel to carry out the ion bombardment treatment by an Ar gas for 30 minutes to the surface of the substrate. After completion of the ion bombardment treatment, inside of the reaction vessel was evacuated until the pressure therein $5.0 \times 10^{-3}$ Pa or lower.

After evacuation, a nitrogen gas was introduced into the reaction vessel to make therein a nitrogen gas atmosphere with a pressure of 2.7 Pa.

With regard to the present products 1 to 9 described in the following Table 1, a bias voltage with −50V was applied to the substrate and the metal evaporation sources which became the composition shown in Table 1 were evaporated by an arc discharge with an arc current of 120 A to form a lower layer.

Then, the nuclei forming process was carried out with regard to the present products 1 to 9. More specifically, a bias voltage shown in Table 3 was applied to the substrate, and an intermittent discharge which alternately repeats arc discharge and stopping discharge shown in the following Table 3 was carried out to the metal evaporation sources. According to this procedure, nuclei of the hard layer with a desired thickness were dispersedly formed onto the surface of the lower layer.

With regard to the present product 10 described in the following Table 1, the nuclei forming process was carried out without forming the lower layer. That is, a bias voltage shown in Table 3 was applied to the substrate to which no lower layer has been formed, and an intermittent discharge which alternately repeats arc discharge and stopping discharge shown in Table 3 was carried out to the metal evaporation sources. According to this procedure, nuclei of the hard layer with a desired thickness were dispersedly formed onto the surface of the substrate.

After subjecting to the nuclei forming process, with regard to the present products 1 to 10, the film forming process was carried out under the conditions shown in Table 3 to form the hard layer. Thereafter, with regard to the present products 1, 3, 4, 6, 7 and 9, a bias voltage with −50V was applied to the substrate and by an arc discharge with the arc current of 120A, the upper layer was formed under the conditions (the composition and the average thickness) shown in Table 1.

With regard to the comparative products 1 to 10 described in the following Table 2, under the conditions shown in the following Table 4, the metal evaporation sources which became the composition shown in Table 2 were evaporated to form the respective layers onto the substrate.

After forming the respective layers onto the surface of the substrate until the predetermined thicknesses shown in Table 1 and Table 2, a power of the heater was turned off, and after the temperature of the sample became 100° C. or lower, the sample (each of the present products 1 to 10 and the comparative products 1 to 10) was taken out from the reaction vessel.

TABLE 1

| | Coating layer | | | | | | | |
|---|---|---|---|---|---|---|---|---|
| | Lower layer | | Hard layer | | | Upper layer | | |
| | | | Target | | | | | |
| Sample No. | Composition | Average thickness (μm) | Composition | thickness of nuclei (nm) | Average thickness (μm) | Composition | Average thickness (μm) | Total thickness (μm) |
| Present product 1 | $Al_{0.7}Ti_{0.3}N$ | 1.5 | $Ti_{0.5}Al_{0.5}N$ | 60 | 3.0 | $Al_{0.7}Ti_{0.3}N$ | 0.5 | 5.0 |
| Present product 2 | $Al_{0.7}Ti_{0.3}N$ | 0.3 | $Ti_{0.6}Al_{0.4}N$ | 100 | 2.0 | — | — | 2.3 |
| Present product 3 | $Al_{0.7}Cr_{0.3}N$ | 0.2 | $Ti_{0.5}Al_{0.4}Cr_{0.1}N$ | 60 | 4.5 | $Al_{0.7}Cr_{0.3}N$ | 0.2 | 4.9 |
| Present product 4 | $Al_{0.6}Ti_{0.3}Nb_{0.1}N$ | 0.4 | $Ti_{0.7}Zr_{0.3}N$ | 40 | 1.0 | $Al_{0.6}Ti_{0.3}Nb_{0.1}N$ | 0.4 | 1.8 |
| Present product 5 | $Al_{0.6}Ti_{0.3}Si_{0.1}N$ | 0.3 | $Ti_{0.5}Al_{0.4}Cr_{0.1}N$ | 60 | 3.0 | — | — | 3.3 |
| Present product 6 | $Al_{0.6}Ti_{0.3}W_{0.1}N$ | 0.4 | $Ti_{0.5}Al_{0.3}W_{0.1}Mo_{0.1}N$ | 40 | 2.3 | $Al_{0.6}Ti_{0.3}W_{0.1}N$ | 0.4 | 3.1 |
| Present product 7 | $Al_{0.7}Cr_{0.3}N$ | 0.5 | $Ti_{0.6}Al_{0.3}V_{0.1}N$ | 80 | 1.0 | $Al_{0.7}Cr_{0.3}N$ | 0.5 | 2.0 |
| Present product 8 | $Al_{0.7}Cr_{0.3}N$ | 0.3 | $Ti_{0.6}Al_{0.3}Nb_{0.1}M$ | 80 | 3.0 | — | — | 3.3 |
| Present product 9 | $Al_{0.6}Ti_{0.3}Nb_{0.1}N$ | 2.0 | $Ti_{0.5}Al_{0.4}Y_{0.1}N$ | 60 | 7.0 | $Al_{0.6}Ti_{0.3}Nb_{0.1}N$ | 0.2 | 9.2 |
| Present product 10 | — | — | $Ti_{0.5}Al_{0.3}Si_{0.1}Ta_{0.1}N$ | 20 | 4.0 | — | — | 4.0 |

TABLE 2

| | Coating layer | | | | | | |
|---|---|---|---|---|---|---|---|
| | First layer | | Second layer | | Third layer | | |
| Sample No. | Composition | Average thickness (μm) | Composition | Average thickness (μm) | Composition | Average thickness (μm) | Total thickness (μm) |
| Comparative product 1 | TiN | 0.1 | $Ti_{0.5}Al_{0.5}N$ | 3.0 | — | — | 3.1 |
| Comparative product 2 | $Ti_{0.5}Al_{0.5}N$ | 4.0 | — | — | — | — | 4.0 |
| Comparative product 3 | $Ti_{0.5}Al_{0.5}N$ | 1.0 | $Ti_{0.7}Zr_{0.3}N$ | 2.0 | — | — | 3.0 |

TABLE 2-continued

| | Coating layer | | | | | | |
|---|---|---|---|---|---|---|---|
| | First layer | | Second layer | | Third layer | | |
| Sample No. | Composition | Average thickness (μm) | Composition | Average thickness (μm) | Composition | Average thickness (μm) | Total thickness (μm) |
| Comparative product 4 | $Ti_{0.5}Al_{0.4}Hf_{0.1}N$ | 3.0 | — | — | — | — | 3.0 |
| Comparative product 5 | $Ti_{0.5}Al_{0.3}Cr_{0.1}Ta_{0.1}N$ | 2.3 | — | — | — | — | 2.3 |
| Comparative product 6 | TiN | 0.5 | $Ti_{0.6}Al_{0.4}N$ | 4.0 | — | — | 4.5 |
| Comparative product 7 | TiN | 3.0 | — | — | — | — | 3.0 |
| Comparative product 8 | TiN | 0.5 | $Ti_{0.5}Al_{0.4}Y_{0.1}N$ | 1.0 | TiN | 0.5 | 2.0 |
| Comparative product 9 | $Ti_{0.3}Al_{0.7}N$ | 0.1 | $Ti_{0.7}Zr_{0.3}N$ | 3.0 | — | — | 3.1 |
| Comparative product 10 | $Ti_{0.3}Al_{0.7}N$ | 4.0 | — | — | — | — | 4.0 |

TABLE 3

| | Nuclei forming process | | | | | Film forming process | | |
|---|---|---|---|---|---|---|---|---|
| | Arc discharge | | | | | | | |
| | | | | Intermittent discharge conditions | | | | |
| | Bias | | Arc | | | Bias | | Arc |
| Sample No. | voltage (V) | Temperature (° C.) | current (A) | Discharge method | Discharge time (min) | Stopping time (min) | voltage (V) | Temperature (° C.) | current (A) |
| Present product 1 | −20 | 450 | 60 | Intermittent | 1 | 1 | −20 | 550 | 80 |
| Present product 2 | −80 | 450 | 60 | Intermittent | 2 | 1 | −150 | 450 | 80 |
| Present product 3 | −40 | 500 | 60 | Intermittent | 1 | 1 | −40 | 500 | 80 |
| Present product 4 | −60 | 400 | 80 | Intermittent | 1 | 1 | −150 | 400 | 100 |
| Present product 5 | −80 | 500 | 80 | Intermittent | 1 | 1 | −80 | 500 | 100 |
| Present product 6 | −40 | 300 | 80 | Intermittent | 1 | 1 | −40 | 600 | 100 |
| Present product 7 | −80 | 500 | 100 | Intermittent | 1 | 2 | −100 | 500 | 120 |
| Present product 8 | −60 | 400 | 100 | Intermittent | 1 | 1 | −60 | 550 | 120 |
| Present product 9 | −40 | 450 | 100 | Intermittent | 1 | 1 | −40 | 600 | 120 |
| Present product 10 | −40 | 500 | 100 | Intermittent | 0.5 | 0.5 | −40 | 550 | 150 |

TABLE 4

| Sample No. | Bias voltage (V) | Temperature (° C.) | Arc current (A) |
|---|---|---|---|
| Comparative product 1 | −40 | 400 | 80 |
| Comparative product 2 | −40 | 550 | 80 |
| Comparative product 3 | −20 | 450 | 80 |
| Comparative product 4 | −20 | 500 | 100 |
| Comparative product 5 | −120 | 700 | 100 |
| Comparative product 6 | −120 | 650 | 100 |
| Comparative product 7 | −100 | 550 | 120 |
| Comparative product 8 | −200 | 650 | 120 |
| Comparative product 9 | −150 | 600 | 120 |
| Comparative product 10 | −100 | 750 | 150 |

An average thickness of the respective layers of the obtained samples was obtained as follows. That is, at the position nearer to 50 μm from the blade edge of the surface opposed to the metal evaporation sources of the coated cutting tool toward the center portion of said surface, the cross-sections were observed by TEM at three points. By calculating an average value of the obtained three measured values, an average thickness was obtained. Also, a composition of the respective layers of the obtained samples was measured by using EDS at the cross-section nearer to 50 μm from the blade edge of the surface opposed to the metal evaporation sources of the coated cutting tool toward the center portion of said surface. These results are also shown in the above-mentioned Tables 1 and 2. Incidentally, the composition ratio of the metallic elements of the respective layers in Tables 1 and 2 shows an atomic ratio of the respective metallic elements based on the whole metallic elements in the metallic compounds constituting the respective layers.

The obtained samples were polished by a diamond paste from the surface of the hard layer to the depth of 100 nm, and further polished in a mirror state by using colloidal silica. With regard to the present products 1, 3, 4, 6, 7 and 9, polishing was carried out from the surface of the upper layer toward the inside thereof until the hard layer had been exposed. With regard to the samples having unevenness at the hard layer, mirror polishing was continued until it was disappeared. The surface structure of the hard layer which became a mirror surface was observed by EBSD, and an average grain size of grains of the hard layer was measured. EBSD was so set that the step size of 0.05 μm, the measurement range of 30 μm×50 μm, and the boundary where the orientation difference of 5° or more were deemed to be the grain boundary. A diameter of the circle with the equal area to the area of a certain crystal grain of the hard layer is made a grain diameter of the crystal grain. According to the similar method, the grain diameters of the crystal grains contained in the observed visual field were obtained, and the average value is made an average grain size of the grains constituting the hard layer. With regard to the average grain size of the comparative products, the average grain size was obtained for the layer having the thickest average thickness. The measurement results of the average grain sizes of the respective samples are shown in the following Table 5.

TABLE 5

| Sample No. | Average grain size (nm) |
|---|---|
| Present product 1 | 320 |
| Present product 2 | 485 |
| Present product 3 | 396 |
| Present product 4 | 590 |
| Present product 5 | 414 |
| Present product 6 | 250 |
| Present product 7 | 380 |
| Present product 8 | 276 |
| Present product 9 | 202 |
| Present product 10 | 340 |
| Comparative product 1 | 592 |
| Comparative product 2 | 350 |
| Comparative product 3 | 510 |
| Comparative product 4 | 380 |
| Comparative product 5 | 120 |
| Comparative product 6 | 155 |
| Comparative product 7 | 294 |
| Comparative product 8 | 148 |
| Comparative product 9 | 200 |
| Comparative product 10 | 50 |

Figure 2:
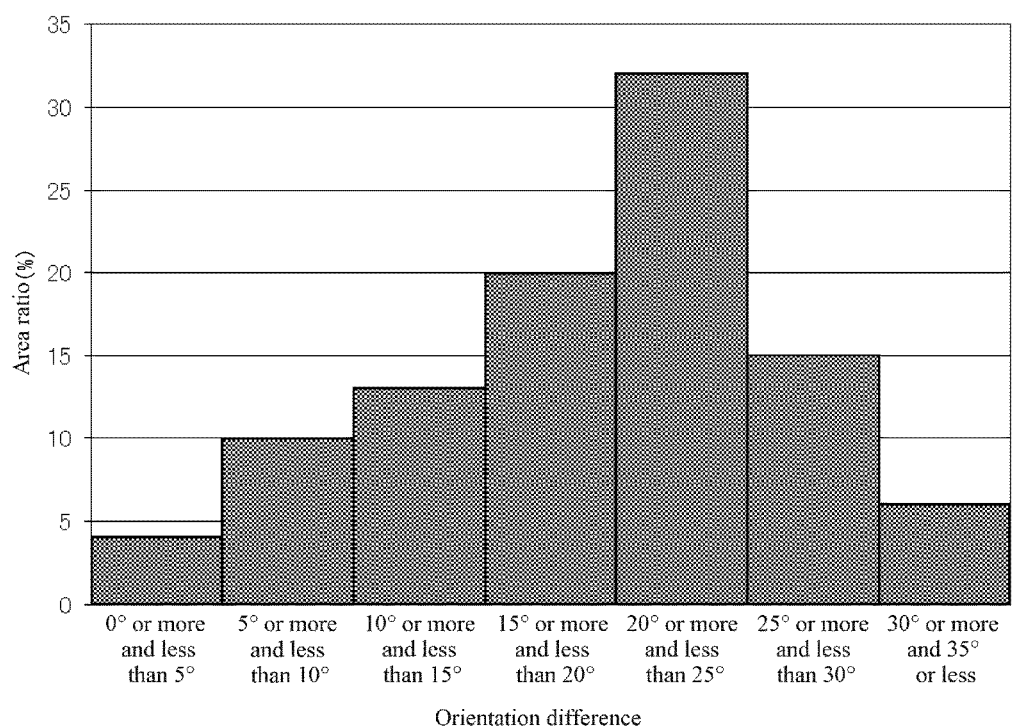
FIG. 2 is a graph of the comparative product 2 in Example in which a division of a pitch of 5° is taken on the horizontal axis, and a ratio (an area ratio) of a total of an area B of a cross-section of grains of the hard layer in the each division per an each pitch based on a total A is taken on the vertical axis.

The polished surface of the hard layer of the obtained sample was observed by FE-SEM, and the total area A of the cross-section of the grains of the hard layer within the range of the orientation difference of 0° or more and 35° or less was measured by using EBSD attached to the FE-SEM. Then, the areas of the cross-section of the grains of the hard layer where the orientation difference is within the range of 0° or more and 35° or less were divided for each pitch of 5°, and the total of the area B of the cross-section of the grains of the hard layer existing in the respective divisions was obtained. The total B of these respective divisions were shown as a ratio based on the above-mentioned total A (100 area %). The same procedure was carried out with regard to the comparative products, and with regard to the layer having the thickest average thickness, the total area of the cross-section of the grains of the layer in the respective divisions of the orientation difference was obtained. The above measurement results are shown in the following Table 6. Also, a graph of the present product 6 obtained by such a measurement is shown in FIG. 1, in which a division of a pitch of 5° is taken on the horizontal axis, and a ratio (an area ratio) of the total of the area B of the cross-section of the grains of the hard layer in the each division per an each pitch based on the total A is taken on the vertical axis. The similar graph with regard to the comparative product 2 is shown in FIG. 2.

Incidentally, the measurement by EBSD was carried out as follows. The sample in which the hard layer has polished was set to FE-SEM. An electron beam was irradiated to the sample with an incident angle of 70°, with an accelerating voltage of 15 kV and an irradiation current of 0.5 nA. With the setting of EBSD that the measurement range was 30 μm×50 μm, and the step size was 0.05 μm, measurements of the orientation difference and the cross-sectional area of the respective grains were carried out. The area of the cross-section of the grains of the hard layer in the measurement range was made the total sum of the pixels corresponding to the area. When the step size is 0.01 μm, then an area per a pixel becomes 0.0065 μm². That is, the total of the area B of the cross-section of the grains in the respective divisions per each 5° pitch based on the orientation difference of the grains of the hard layer was obtained by summing up the pixels occupied by the cross-section of the grains corresponding to the respective division, and calculated by converting to the area. And the ratios of the obtained values based on the above-mentioned total A (100 area %) were obtained.

TABLE 6

| Sample No. | Total B (area %) of area of cross-section of grains of hard layer in respective divisions | | | | | | | Total Sa (area %) of area of cross-section of hard layer grains within the range of 0° or more and less than 15° | Division in which total of area of cross-section of grains of hard layer is maximum |
|---|---|---|---|---|---|---|---|---|---|
| | 0° or more and less than 5° | 5° or more and less than 10° | 10° or more and less than 15° | 15° or more and less than 20° | 20° or more and less than 25° | 25° or more and less than 30° | 30° or more and less than 35° | | |
| Present product 1 | 12 | 26 | 25 | 20 | 12 | 4 | 1 | 63 | 5° or more and less than 10° |
| Present product 2 | 10 | 25 | 30 | 18 | 13 | 4 | 0 | 65 | 10° or more and less than 15° |
| Present product 3 | 21 | 22 | 18 | 16 | 13 | 8 | 2 | 61 | 5° or more and less than 10° |
| Present product 4 | 25 | 22 | 19 | 14 | 12 | 6 | 2 | 66 | 0° or more and less than 5° |
| Present product 5 | 13 | 25 | 21 | 15 | 14 | 12 | 0 | 59 | 5° or more and less than 10° |
| Present product 6 | 32 | 21 | 15 | 13 | 8 | 7 | 4 | 68 | 0° or more and less than 5° |
| Present product 7 | 8 | 18 | 32 | 18 | 12 | 8 | 4 | 58 | 10° or more and less than 15° |
| Present product 8 | 10 | 16 | 29 | 18 | 15 | 11 | 2 | 55 | 10° or more and less than 15° |
| Present product 9 | 12 | 26 | 24 | 18 | 10 | 6 | 4 | 62 | 5° or more and less than 10° |
| Present product 10 | 22 | 18 | 14 | 10 | 8 | 12 | 16 | 54 | 0° or more and less than 5° |
| Comparative product 1 | 0 | 5 | 14 | 24 | 35 | 16 | 6 | 19 | 20° or more and less than 25° |
| Comparative product 2 | 4 | 10 | 13 | 20 | 32 | 15 | 6 | 27 | 20° or more and less than 25° |
| Comparative product 3 | 3 | 7 | 12 | 16 | 28 | 18 | 16 | 22 | 20° or more and less than 25° |
| Comparative product 4 | 2 | 6 | 13 | 17 | 28 | 15 | 19 | 21 | 20° or more and less than 25° |

TABLE 6-continued

| Sample No. | Total B (area %) of area of cross-section of grains of hard layer in respective divisions | | | | | | | Total Sa (area %) of area of cross-section of hard layer grains within the range of 0° or more and less than 15° | Division in which area of cross-section of total of area of grains of hard layer is maximum |
|---|---|---|---|---|---|---|---|---|---|
| | 0° or more and less than 5° | 5° or more and less than 10° | 10° or more and less than 15° | 15° or more and less than 20° | 20° or more and less than 25° | 25° or more and less than 30° | 30° or more and less than 35° | | |
| Comparative product 5 | 3 | 10 | 13 | 15 | 18 | 23 | 18 | 26 | 25° or more and less than 30° |
| Comparative product 6 | 1 | 10 | 12 | 14 | 19 | 32 | 12 | 23 | 25° or more and less than 30° |
| Comparative product 7 | 0 | 5 | 11 | 15 | 17 | 28 | 24 | 16 | 25° or more and less than 30° |
| Comparative product 8 | 2 | 12 | 10 | 14 | 15 | 32 | 15 | 24 | 25° or more and less than 30° |
| Comparative product 9 | 0 | 3 | 13 | 16 | 21 | 26 | 21 | 16 | 25° or more and less than 30° |
| Comparative product 10 | 3 | 7 | 10 | 17 | 20 | 24 | 19 | 20 | 25° or more and less than 30° |

With regard to the obtained samples, compression stress of the hard layer was measured by the $\sin^2 \psi$ method using an X-ray stress measurement device. The compression stress was obtained by measuring the stress at the optional 10 points contained in the portion participating to cutting, and calculating the average value. The compression stress of the comparative products was similarly obtained for the layer having the thickest average thickness. The results are shown in the following Table 7.

TABLE 7

| Sample No. | Compression stress (GPa) |
|---|---|
| Present product 1 | 0.2 |
| Present product 2 | 3.0 |
| Present product 3 | 0.5 |
| Present product 4 | 3.4 |
| Present product 5 | 1.5 |
| Present product 6 | 0.7 |
| Present product 7 | 2.1 |
| Present product 8 | 1.0 |
| Present product 9 | 0.7 |
| Present product 10 | 0.5 |
| Comparative product 1 | 0.5 |
| Comparative product 2 | 0.8 |
| Comparative product 3 | 0.3 |
| Comparative product 4 | 0.1 |
| Comparative product 5 | 2.5 |
| Comparative product 6 | 2.4 |
| Comparative product 7 | 2.1 |
| Comparative product 8 | 4.2 |
| Comparative product 9 | 3.0 |
| Comparative product 10 | 1.9 |

By using the obtained samples, the following Cutting test 1 and Cutting test 2 were carried out, and fracture resistance and wear resistance of the samples were evaluated.

[Cutting Test 1: Evaluation of Fracture Resistance]
Work piece material: S45C,
Shape of work piece material: Columnar shape with φ105 mm×220 mm (two grooves are provided in the lengthwise direction.),
Cutting speed: 140 m/min,
Feed: 0.4 mm/rev,
Depth of cut: 1.5 mm,
Coolant: present,
Evaluation item: A time until the sample had been fractured (defect is generated at the cutting blade portion of the sample) was made the tool life, and a processed length until the sample reached to the tool life from starting the cutting was measured.

[Cutting Test 2: Evaluation of Wear Resistance]
Work piece material: S45C,
Shape of work piece material: Columnar shape with φ105 mm×220 mm,
Cutting speed: 220 m/min,
Feed: 0.3 mm/rev,
Depth of cut: 2.0 mm,
Coolant: present,
Evaluation item: A time until the maximum flank wear width had become 0.2 mm was made the tool life, and a processed time until the sample reached to the tool life from starting the cutting was measured.

Incidentally, with regard to the processed length until the sample reached to the tool life in Cutting test 1, it was evaluated by 5 m or more as ○, 3 m or more and less than 5 m as Δ, and less than 3 m as X. Also, with regard to the processed time until the sample reached to the tool life in Cutting test 2, it was evaluated by 5 min or longer as ○, 3 min or longer and shorter than 5 min as Δ, and shorter than 3 min as X. In the evaluation, it is the order of (excellent) ○>Δ>X (poor). Therefore, when the result is ○, it shows that the cutting performance of the sample is excellent. The results of the obtained evaluation were shown in the following Table 8.

TABLE 8

| Sample No. | Cutting test 1 Evaluation of fracture resistance | | Cutting test 2 Evaluation of wear resistance | |
|---|---|---|---|---|
| | Processing length (m) | Evaluation | Processing time (min) | Evaluation |
| Present product 1 | 5.6 | ○ | 6.3 | ○ |
| Present product 2 | 9.2 | ○ | 5.4 | ○ |
| Present product 3 | 5.8 | ○ | 6.7 | ○ |
| Present product 4 | 5.2 | ○ | 5.9 | ○ |
| Present product 5 | 6.8 | ○ | 6.5 | ○ |
| Present product 6 | 6.0 | ○ | 6.1 | ○ |
| Present product 7 | 7.8 | ○ | 5.2 | ○ |
| Present product 8 | 5.8 | ○ | 5.7 | ○ |
| Present product 9 | 5.5 | ○ | 8.2 | ○ |
| Present product 10 | 5.2 | ○ | 5.5 | ○ |
| Comparative product 1 | 2.5 | X | 5.2 | ○ |
| Comparative product 2 | 3.2 | Δ | 5.3 | ○ |
| Comparative product 3 | 2.1 | X | 4.4 | Δ |

TABLE 8-continued

| Sample No. | Cutting test 1 Evaluation of fracture resistance | | Cutting test 2 Evaluation of wear resistance | |
|---|---|---|---|---|
| | Processing length (m) | Evaluation | Processing time (min) | Evaluation |
| Comparative product 4 | 3.5 | Δ | 5.3 | ○ |
| Comparative product 5 | 3.2 | Δ | 4.0 | Δ |
| Comparative product 6 | 5.2 | ○ | 3.5 | Δ |
| Comparative product 7 | 4.2 | Δ | 3.2 | Δ |
| Comparative product 8 | 2.2 | X | 2.3 | X |
| Comparative product 9 | 5.8 | ○ | 4.3 | Δ |
| Comparative product 10 | 6.2 | ○ | 2.4 | X |

From the results of Table 8, evaluation of the fracture resistance test and evaluation of the wear resistance test of the present products are all ○. On the other hand, the comparative products had Δ or X in either of the evaluation of the fracture resistance test or the evaluation of the wear resistance test. From the results mentioned above, it can be understood that in the coated cutting tool of the present products, fracture resistance is improved without lowering wear resistance, whereby the tool life is elongated.

INDUSTRIAL APPLICABILITY

The coated cutting tool of the present invention is excellent in wear resistance and fracture resistance, so that it has an elongated tool life than those of the conventional ones whereby it has high industrial applicability.

The invention claimed is:

1. A coated cutting tool which comprises a substrate and a coating layer formed onto a surface of the substrate, wherein
the coating layer contains a hard layer having a composition represented by $(Ti_xM_{1-x})N$ that satisfies $0.45 \leq x \leq 0.9$, wherein M represents at least one kind of an element selected from the group consisting of Zr, Hf, V, Nb, Ta, Cr, Mo, W, Al, Si and Y, and x represents an atomic ratio of a Ti element based on a sum of the Ti element and an M element,
an average grain size of grains comprising the hard layer is 200 nm or more and 600 nm or less, and
a value Sa in area % satisfies 55 area % ≤Sa≤90 area % under conditions such that
(i) the hard layer is polished in a direction substantially parallel to the surface of the substrate to obtain a polished surface,
(ii) an angle formed by a normal line of the polished surface and a normal line at a cubic (311) plane of the grains of the hard layer is determined as an orientation difference,
(iii) A is an area of a cross-section of the grains of the hard layer where orientation differences of the grains are within a range of 0° or more and 35° or less,
(iv) B is an area of a cross-section of the grains of the hard layer where orientation differences of the grains are within a range of 0° or more and less than 15°, and
(v) Sa is computed in terms of a total of the area A and a total of the area B as Sa=B/A×100.

2. The coated cutting tool according to claim 1, wherein an average thickness of the hard layer is 0.5 μm or more and 10 μm or less.

3. The coated cutting tool according to claim 1, wherein the hard layer has compression stress.

4. The coated cutting tool according to claim 1, wherein the hard layer has compression stress of 0.2 GPa or more and 3 GPa or less.

5. The coated cutting tool according to claim 1, wherein the coating layer has a lower layer between the substrate and the hard layer, and
the lower layer has a composition represented by $(Al_yL_{1-y})N$,
wherein L represents at least one kind of an element selected from the group consisting of Ti, Zr, Hf, V, Nb, Ta, Cr, Mo, W, Si and Y, and y represents an atomic ratio of an Al element based on a sum of the Al element and an L element, and satisfies 0.6≤y≤0.9.

6. The coated cutting tool according to claim 5, wherein an average thickness of the lower layer is 0.2 μm or more and 5μm or less.

7. The coated cutting tool according to claim 1, wherein a total thickness of the coating layer is 0.5 μm or more and 10 μm or less.

8. The coated cutting tool according claim 1, wherein the substrate is any of a cemented carbide, cermet, ceramics or a cubic boron nitride sintered body.

9. The coated cutting tool according to claim 1, wherein an average thickness of the hard layer is 0.5 μm or more and 10 μm or less.

10. The coated cutting tool according to claim 9, wherein the hard layer has compression stress.

11. The coated cutting tool according to claim 10, wherein the hard layer has compression stress of 0.2 GPa or more and 3 GPa or less.

12. The coated cutting tool according to claim 11, wherein the coating layer has a lower layer between the substrate and the hard layer, and
the lower layer has a composition represented by $(Al_yL_{1-y})N$,
wherein L represents at least one kind of an element selected from the group consisting of Ti, Zr, Hf, V, Nb, Ta, Cr, Mo, W, Si and Y, and y represents an atomic ratio of an Al element based on a sum of the Al element and an L element, and satisfies 0.6<y<0.9.

13. The coated cutting tool according to claim 12, wherein an average thickness of the lower layer is 0.2 μm or more and 5μm or less.

14. The coated cutting tool according to claim 13, wherein a total thickness of the coating layer is 0.5 μm or more and 10 μm or less.

15. The coated cutting tool according claim 14, wherein the substrate is any of a cemented carbide, cermet, ceramics or a cubic boron nitride sintered body.

* * * * *